United States Patent
Raja et al.

(10) Patent No.: US 10,545,877 B2
(45) Date of Patent: Jan. 28, 2020

(54) APPARATUS AND METHOD FOR ACCESSING AN ADDRESS TRANSLATION CACHE

(71) Applicant: Arm Limited, Cambridge (GB)

(72) Inventors: Abhishek Raja, Austin, TX (US); Michael Filippo, Driftwood, TX (US)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 15/945,900

(22) Filed: Apr. 5, 2018

(65) Prior Publication Data

US 2019/0310948 A1 Oct. 10, 2019

(51) Int. Cl.
*G06F 12/00* (2006.01)
*G06F 12/1027* (2016.01)

(52) U.S. Cl.
CPC .. *G06F 12/1027* (2013.01); *G06F 2212/1024* (2013.01); *G06F 2212/1028* (2013.01); *G06F 2212/68* (2013.01)

(58) Field of Classification Search
CPC ............. G06F 12/1027; G06F 2212/68; G06F 2212/1028; G06F 2212/1024
See application file for complete search history.

(56) References Cited

U.S. PATENT DOCUMENTS

2004/0054867 A1* 3/2004 Stravers ............... G06F 12/1027
  711/207
2011/0276778 A1* 11/2011 Dooley ............... G06F 12/1027
  711/207

* cited by examiner

*Primary Examiner* — Kalpit Parikh
(74) *Attorney, Agent, or Firm* — Nixon & Vanderhye P.C.

(57) ABSTRACT

An apparatus and method are provided for accessing an address translation cache. The address translation cache has a plurality of entries, where each entry is used to store address translation data used when converting a virtual address into a corresponding physical address of a memory system. The virtual address is generated from a plurality of source values. Allocation circuitry is responsive to received address translation data, to allocate an entry within the address translation cache to store the received address translation data. A hash value indication is associated with the allocated entry, where the hash value indication is computed from the plurality of source values used to generate a virtual address associated with the received address translation data. Lookup circuitry is responsive to an access request associated with a target virtual address, to perform a lookup process employing a target hash value computed from the plurality of source values used to generate the target virtual address, in order to identify any candidate matching entry in the address translation cache. When there is at least one candidate matching entry, a virtual address check process is then performed in order to determine whether any candidate matching entry is an actual matching entry whose address translation data enables the target virtual address to be translated to a corresponding target physical address. Such an approach can significantly improve the performance of accesses to the address translation cache, and can also give rise to power consumption savings.

14 Claims, 9 Drawing Sheets

FIG. 9 ically illustrating a virtual
APPARATUS AND METHOD FOR ACCESSING AN ADDRESS TRANSLATION CACHE

BACKGROUND

The present technique relates to an apparatus and method for accessing an address translation cache.

It is known to provide data processing systems which incorporate an address translation cache, such as a translation lookaside buffer (TLB), to store address translation data relating to the translation of virtual addresses to physical addresses. The provision of an address translation cache is useful in improving performance by reducing the number of slow page table walks to memory required in order to obtain the required address translation data.

Nevertheless, as systems require ever higher performance, the timing requirements for performing a lookup within the address translation cache in order to determine whether the required address translation data is present can limit the address translation cache's capacity, and thereby have a performance impact. In addition, the high rate of access and use of large gates to meet the frequency target can lead to significant power consumption. For example, to seek to ensure a high hit rate, a level one TLB may be implemented as a fully associative structure, but the lookup process then requires a check in respect of each of the entries of the level one TLB in order to determine if a hit is present. The lookup process involves using the virtual address to check against corresponding virtual address bits in each of the TLB entries, and this approach has timing and power implications.

Accordingly, it would be desirable to provide an improved mechanism for accessing an address translation cache.

SUMMARY

In one example configuration, there is provided an apparatus comprising: an address translation cache having a plurality of entries, each entry to store address translation data used when converting a virtual address into a corresponding physical address of a memory system, the virtual address being generated from a plurality of source values; allocation circuitry, responsive to received address translation data, to allocate an entry within the address translation cache to store the received address translation data, a hash value indication being associated with the allocated entry, where the hash value indication is computed from the plurality of source values used to generate a virtual address associated with the received address translation data; and lookup circuitry, responsive to an access request associated with a target virtual address, to perform a lookup process employing a target hash value computed from the plurality of source values used to generate the target virtual address, in order to identify any candidate matching entry in the address translation cache, and when there is at least one candidate matching entry to then perform a virtual address check process in order to determine whether any candidate matching entry is an actual matching entry whose address translation data enables the target virtual address to be translated to a corresponding target physical address.

In another example configuration, there is provided a method of accessing an address translation cache having a plurality of entries, each entry storing address translation data used when converting a virtual address into a corresponding physical address of a memory system, the virtual address being generated from a plurality of source values, the method comprising: allocating, responsive to received address translation data, an entry within the address translation cache to store the received address translation data, a hash value indication being associated with the allocated entry, where the hash value indication is computed from the plurality of source values used to generate a virtual address associated with the received address translation data; performing a lookup process in response to an access request associated with a target virtual address, the lookup process employing a target hash value computed from the plurality of source values used to generate the target virtual address, in order to identify any candidate matching entry in the address translation cache; and when the lookup process identifies at least one candidate matching entry, performing a virtual address check process in order to determine whether any candidate matching entry is an actual matching entry whose address translation data enables the target virtual address to be translated to a corresponding target physical address.

In a still further example configuration, there is provided an apparatus comprising: address translation cache means having a plurality of entries, each entry for storing address translation data used when converting a virtual address into a corresponding physical address of a memory system, the virtual address being generated from a plurality of source values; allocation means for allocating, responsive to received address translation data, an entry within the address translation cache means to store the received address translation data, a hash value indication being associated with the allocated entry, where the hash value indication is computed from the plurality of source values used to generate a virtual address associated with the received address translation data; and lookup means, responsive to an access request associated with a target virtual address, for performing a lookup process employing a target hash value computed from the plurality of source values used to generate the target virtual address, in order to identify any candidate matching entry in the address translation cache means, and when there is at least one candidate matching entry for then performing a virtual address check process in order to determine whether any candidate matching entry is an actual matching entry whose address translation data enables the target virtual address to be translated to a corresponding target physical address.

BRIEF DESCRIPTION OF THE DRAWINGS

The present technique will be described further, by way of illustration only, with reference to examples thereof as illustrated in the accompanying drawings, in which.

DESCRIPTION OF EXAMPLES

In accordance with one example arrangement, an apparatus is provided that has an address translation cache having a plurality of entries, where each entry is arranged to store address translation data used when converting a virtual address into a corresponding physical address of a memory system. The virtual address is generated from a plurality of source values. For example, the virtual address may be generated by adding an index value to a base value in order to generate the virtual address.

Allocation circuitry is provided that is responsive to received address translation data, to allocate an entry within the address translation cache to store the received address translation data. A hash value indication is associated with the allocated entry, where the hash value indication is computed from the plurality of source values used to generate a virtual address associated with the received address translation data. As will be discussed in more detail later, the way in which the hash value indication is associated with the allocated entry will depend on the way in which the address translation cache is structured, for example whether it is a fully associative structure or a set associative structure. However, because the hash value is associated with the allocated entry at the time of allocation, hash value information can be used during a subsequent lookup process to increase the performance. For example, it typically takes less time to compute the hash value than to compute the virtual address, and as a result the access time is reduced when the hash value is used during the lookup process. Since the access time is reduced, it is then possible to increase overall capacity of the address translation cache relative to one accessed using the virtual address. Further, in some implementations the use of the hash value can also potentially save power.

The apparatus has lookup circuitry which is responsive to an access request associated with a target virtual address, to perform a lookup process employing a target hash value computed from the plurality of source values used to generate the target virtual address, in order to identify any candidate matching entry in the address translation cache. Since the target hash value is computed from the source values it can be made available to use in the lookup process even before the target virtual address has been computed from the source values, hence reducing lookup latency. Further, it will typically be the case that the target hash value is significantly smaller than the target virtual address, and hence in some instances this can give rise to power consumption savings when performing the lookup process.

The lookup circuitry is further arranged such that when there is at least one candidate matching entry identified by the above lookup process, a virtual address check process is then performed in order to determine whether any candidate matching entry is an actual matching entry whose address translation data enables the target virtual address to be translated to a corresponding target physical address. In particular, the target hash value may not be unique for a particular plurality of source values, and accordingly whilst it can identify candidate matching entries, the virtual address check is then used to detect an actual match.

In one example arrangement, the virtual address can be computed from the source values whilst the lookup circuitry is performing the lookup process using the target hash value, so that once that lookup process has completed, and any candidate matching entries have been identified, the target virtual address is then available to be used in the virtual address check process in order to determine whether there is an actual matching entry.

It has been found that such an approach allows for a larger address translation cache structure (whilst maintaining desired access timing) and provides significant performance improvements, and also can in some instances give rise to power consumption savings.

There are a number of ways in which the hash value can be generated. For example the processing circuitry that issues the access request, and that computes the virtual address from the source values, may include hash generation circuitry to generate the corresponding hash value for a given plurality of source values. However, alternatively, the components associated with the address translation cache may comprise hash generation circuitry, that is responsive to receipt of a plurality of source values from a request source (such as the processing circuitry), to generate a corresponding hash value. Hence, in that instance the request source may merely provide the source values when issuing an access request, and then in due course provide the virtual address computed from the source values.

In one example arrangement, the address translation data in each entry is associated with a range of virtual addresses, and the lookup circuitry is arranged to determine presence of the actual matching entry when the target virtual address falls within the range of virtual addresses covered by the address translation data in a candidate matching entry.

In one example arrangement, the lookup circuitry is arranged to perform the virtual address check process to determine whether a specified portion of the target virtual address matches a corresponding portion of the virtual address indication of the address translation data in a candidate matching entry, the specified portion being dependent on the range.

Typically the range of virtual addresses will be associated with a page in memory, and it can be determined whether the target virtual address falls within the virtual address range of that page by masking off some of the low order bits when comparing the target virtual address with the virtual address indication provided as part of the address translation data. The number of low order bits that are masked off will depend on the page size of the page in memory.

The hash value indication that is associated with the allocated entry can be computed in a variety of ways, but in one example configuration is computed using selected portions of the plurality of source values, the selected portions being selected dependent on the range of virtual addresses associated with the received address translation data.

The address translation cache can be structured in a variety of ways. However, in one example arrangement, the address translation cache has a fully associative structure, and the allocation circuitry is arranged to associate the hash value indication with the allocated entry by storing the hash value indication in association with the allocated entry. In one example configuration, a field within each allocated entry is provided for storing the hash value indication associated with the address translation data stored in that entry.

In such a fully associative structure, when the lookup process is performed, the target hash value may be compared with the hash value indication stored in association with each entry in order to detect if there is a candidate matching entry. In one example arrangement, the allocation circuitry is arranged to prevent more than one entry having the same hash value indication associated therewith, and hence the result of the lookup process will either be that a single candidate matching entry is identified, or no candidate matching entry is identified. If a single candidate matching entry is identified, then the virtual address check process can be used to determine whether that candidate matching entry is in fact an actual matching entry whose address translation data can be used to translate the target virtual address into the corresponding target physical address.

When the above described techniques are employed in association with a fully associative address translation cache, performance benefits are realised by enabling the lookup process to begin before the virtual address has actually been computed, using the hash value generated from the corresponding source values. Further, the power consumed in the lookup process can be significantly reduced, as the hash value is typically significantly smaller than the virtual address that would otherwise have been used to perform the lookup process, thus reducing the power consumed in performing the lookup process.

However, there is no requirement for the address translation cache to be a fully associative address translation cache in order to utilise the above described techniques. In an alternative arrangement, the address translation cache has a set associative structure, and the allocation circuitry is arranged to associate the hash value indication with the allocated entry by using the hash value indication as an index to identify a set of entries within which the received address translation data is allowed to be allocated.

In accordance with such an arrangement, the lookup circuitry may be arranged to use the target hash value during the lookup process to identify a set of entries within the address translation cache, with the set of entries forming a set of candidate matching entries. Once the relevant set of entries has been identified using the target hash value, then the virtual address check process can be used in respect of each of the entries in the set in order to determine whether any of those candidate matching entries is an actual matching entry whose address translation data enables the target virtual address to be translated to a corresponding target physical address. Again, a performance benefit can be realised as the lookup process can begin before the virtual address has been computed.

Particular examples will now be described with reference to the Figures.

Figure 1:
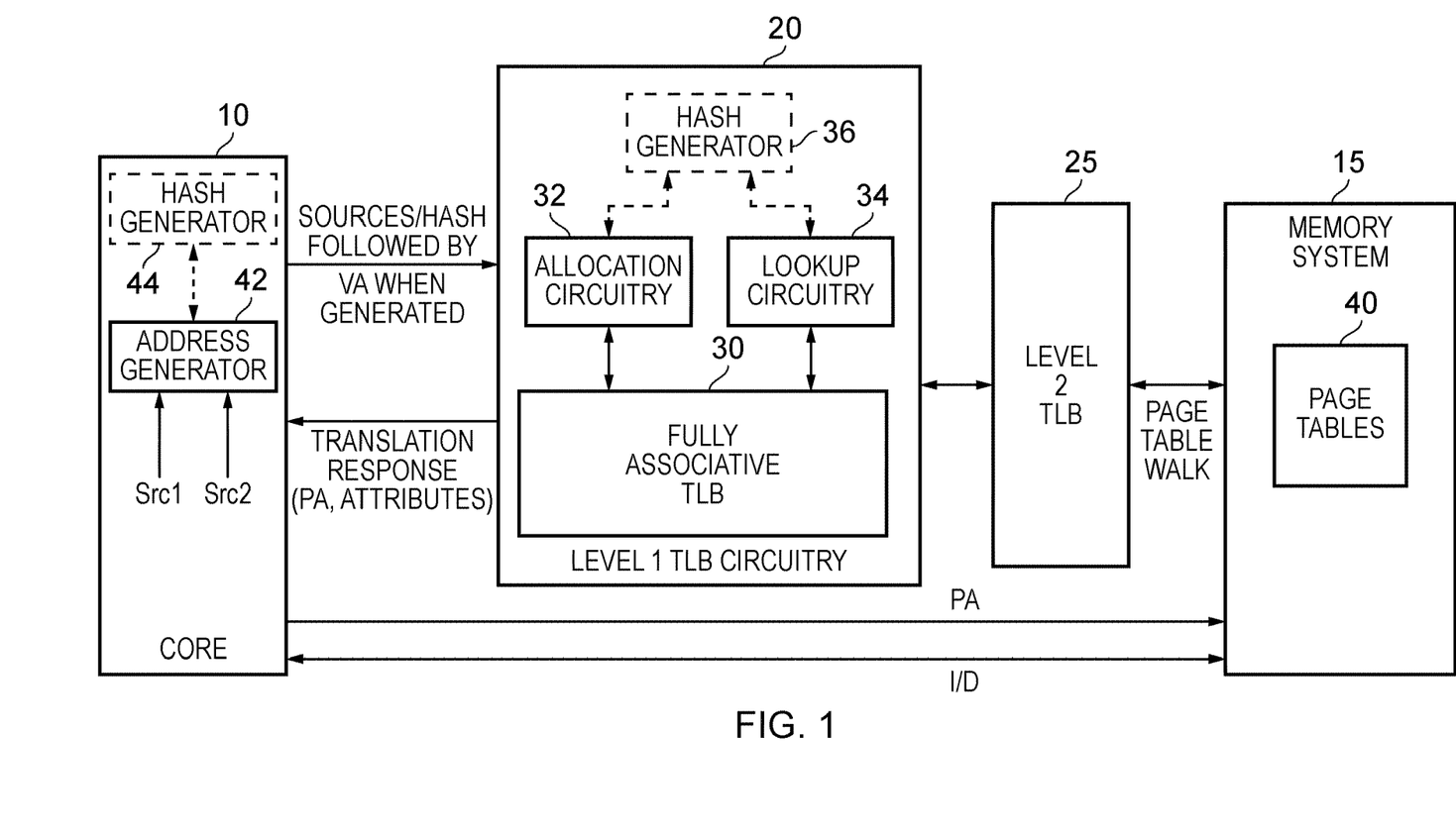
FIG. 1 is a block diagram of a system in accordance with one example arrangement.

FIG. 1 schematically illustrates a data processing system including a processor core 10 for executing program instructions and for performing data accesses (both instruction fetches and accesses to data to be manipulated) using virtual addresses VA. These virtual addresses are subject to address translation to physical addresses PA by address translation circuitry, which in the example illustrated in FIG. 1 consists of a level one TLB unit 20 and optionally a level two TLB unit 25. The physical addresses are used to control access to instructions and data in a memory system 15. The memory system 15 may comprise a memory hierarchy, such as multiple levels of cache memory and a main memory or other non-volatile storage.

As shown in FIG. 1, the level one TLB circuitry 20 includes an address translation cache in the form of a fully associative TLB 30. The TLB 30 has a plurality of entries, where each entry stores address translation data used when converting a virtual address into a corresponding physical address of a memory system. The address translation data is determined by performing page table walk operations in respect of page tables 40 stored within the memory system 15. Through use of the page table walk operations, address translation data may be determined enabling a virtual address to be converted into a physical address, and that address translation data may be stored within the fully associative TLB 30.

Whilst only a single level of TLB structure may be provided, in the example illustrated in FIG. 1 there is also a larger level two TLB 25. Accordingly, if a miss is detected in the level one TLB 20, a lookup can be performed in the level two TLB 25, and only if there is then a miss in the level two TLB will a page table walk process be needed. Once the address translation data has been retrieved from the level two TLB in response to an access request issued by the core, it can be stored within an entry of the fully associative TLB 30 of the level one TLB circuit 20 to provide for quicker access to that address translation data in the future.

As shown in FIG. 1, the level one TLB circuitry 20 has allocation circuitry 32 for allocating address translation data into an entry of the TLB 30, this for example being done when address translation data is received from the level two TLB 25, or obtained through a page table walk process in respect of the page tables 40. Further, lookup circuitry 34 is provided which is responsive to access requests issued from the core 10 in order to perform a lookup operation within the TLB 30 in order to determine whether address translation data is present within the TLB 30 which can be used to convert the virtual address, output by the core as part of the access request, into a corresponding physical address within the memory system 15.

The processor core 10 includes an address generator 42 for generating a virtual address to be output as part of an access request to the level one TLB circuitry 20. The virtual address is typically generated from a plurality of source values, for example by adding an index value to a base value in order to generate the virtual address. Typically, lookups would be performed within the TLB 30 using that virtual address. However, as will be discussed later, in accordance with the techniques described herein an initial lookup can be performed using a hash value generated from the source values, hence enabling the lookup operation to begin before the virtual address has been computed, thereby giving rise to performance benefits. Further, the use of such a hash value to perform the initial lookup operation can give rise to significant power savings. In particular, each entry in the fully associative TLB 30 can be arranged to include a field providing a hash value indication that is derived from the source values that were used to generate a virtual address associated with the address translation data, and the initial lookup operation can check that hash value indication against the hash value determined from the plurality of source values for the current access request. The fully associative TLB 30 can be arranged as a contents addressable memory (CAM) structure, and accordingly a CAM lookup process can be used to compare the hash values in each entry of the TLB with the hash value associated with the access request. Since the hash value will typically be significantly smaller than the virtual address, this can offer significant power consumption savings relative to a known approach that would have used the virtual address in the CAM lookup process.

The allocation circuitry 32 can be configured so as to prevent more than one entry within the TLB 30 having the same hash value indication stored therein, and accordingly when a lookup operation is initiated by the lookup circuitry 34 using a hash value associated with the current access request, there will be at most one entry for which a hit is detected. That entry will be referred to herein as a candidate matching entry.

Since the hash value generated from the source values will typically not be unique for any particular combination of source values, then the detection of a match based on the hash value is not sufficient to categorically determine whether there is a hit or not for the target virtual address associated with the access request. Accordingly, in the presence of a candidate matching entry, the lookup circuitry 34 then performs a virtual address check process in order to determine whether the candidate matching entry is an actual matching entry whose address translation data enables the target virtual address to be translated to a corresponding target physical address. By this stage the target virtual address will have been computed by the address generator 42 and provided from the core to the TLB circuitry 20, and accordingly is available to use during the virtual address check process in the event that a candidate matching entry has been identified based on the hash lookup.

Figure 3:
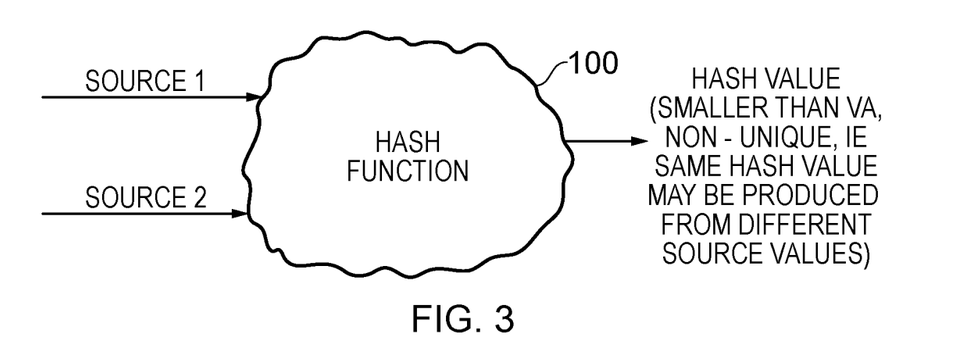
FIG. 3 is a diagram schematically illustrating how a hash function can be employed in order to generate a hash value from multiple source values that are used to generate a virtual address.

The hash value can be generated in a variety of ways and any suitable hash function can be employed to receive as input the source values, and generate a hash value as an output. This is illustrated schematically in FIG. 3, where a hash function 100 is employed to receive the input source values and generate an output hash value. Any known hash function can be employed as the hash function 100 in order to generate the hash value. However, a common feature of the hash value generated, irrespective of the hash function used, will be that the hash value will typically be smaller than the virtual address that would be generated from the source values, i.e will be represented by less bits. It will also as a result be non-unique for a particular input set of source values, such that the same hash value may be produced from different source values. Hence, the earlier-mentioned virtual address check is then used to determine whether a candidate matching entry detected using the hash value is in fact an actual matching entry.

The hash value can be generated either within the core, as indicated by the hash generator 44, or within the TLB circuitry, as indicated by the hash generator 36. Hence, by way of example, if the hash generator 36 is used, then when an access request is to be issued by the core, the core can initially output the source values to the TLB circuitry 20, so that the hash generator 36 can generate the corresponding hash value to be used by the lookup circuitry 34. Subsequently, once the address generator 42 has generated the virtual address, that virtual address can be forwarded from the core 10 to the TLB circuitry 20 for use in the subsequent address check process in the event that a candidate matching entry is found within the fully associative TLB using the hash lookup. Conversely, if the hash generator 44 is used, then the source values themselves do not need to be forwarded to the level one TLB circuitry 20, and instead the hash generator 44 can generate the hash value which is then forwarded to the TLB circuitry 20 for use by the lookup circuitry 34.

When new address translation data is allocated by the allocation circuitry, then if a local hash generator 36 is provided, that can be used to generate the hash value indication derived from the appropriate source values. Alternatively, that hash value can be provided from the core via the hash generator 44. In particular, an allocation of address translation data into the TLB 30 will typically result from a miss being detected in respect of an access request issued by the core, and hence the corresponding source values or hash information can be retained for use when allocating the obtained address translation data into an entry of the TLB 30.

Figure 2:
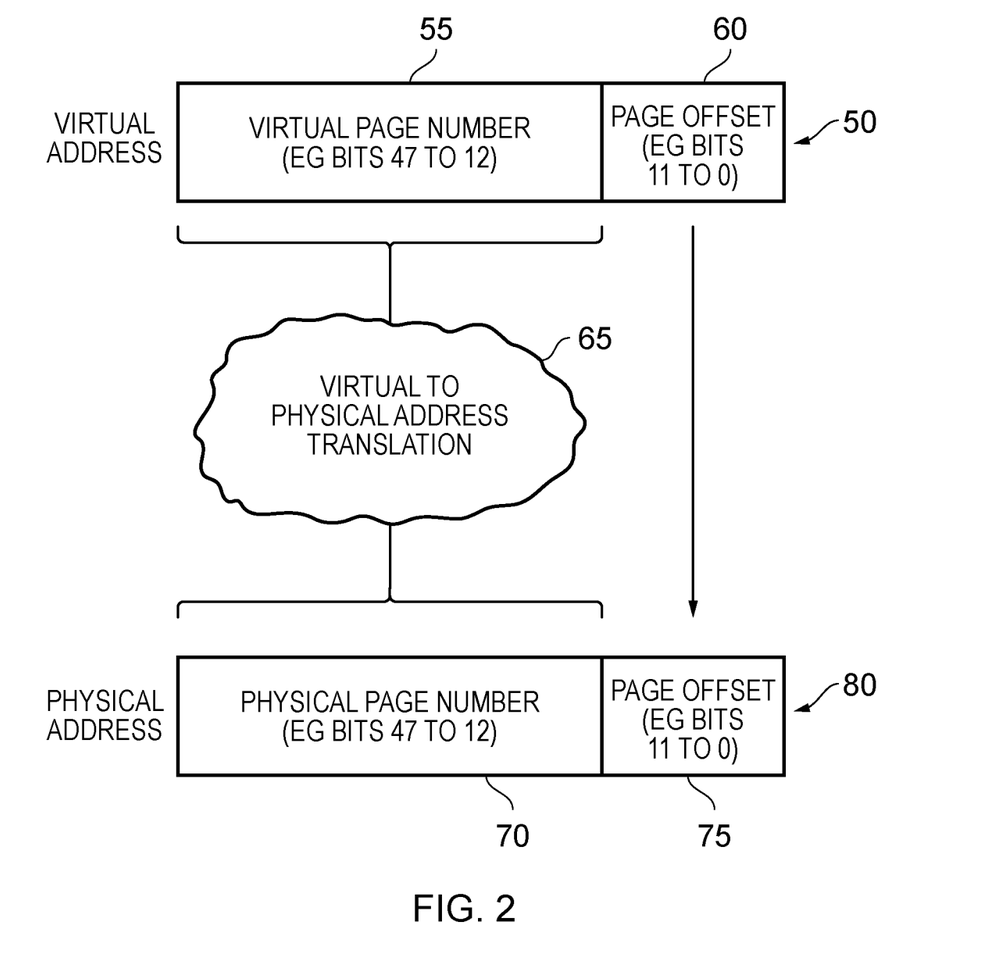
FIG. 2 is a diagram schematically illustrating a virtual address to physical address translation process.

FIG. 2 is a diagram schematically illustrating the address translation process. A virtual address 50 can be considered to comprise a number of bits 55 identifying a virtual page number, and some other bits 60 identifying a page offset. The number of bits forming the virtual page number and the number of bits forming the page offset will depend on the page size, but by way of a specific example the virtual address may comprises 48 bits, with bits 47 to 12 forming the virtual page number and bits 11 to 0 forming the page offset bits. The address translation operation performed by the address translation circuitry 20 is illustrated schematically by the element 65 shown in FIG. 2, and serves to obtain address translation information sufficient to enable the virtual page number bits 55 to be translated into equivalent bits 70 of a physical address 80 identifying a physical page number. The page offset bits are not altered, and accordingly the page offset bits 75 are directly determined from the page offset bit 60 in the virtual address. Whilst in FIG. 2 it is assumed that the physical address has the same number of bits as the virtual address, this is not a requirement and in some implementations the physical address may for example be represented by a smaller number of bits than the virtual address.

Figure 4:
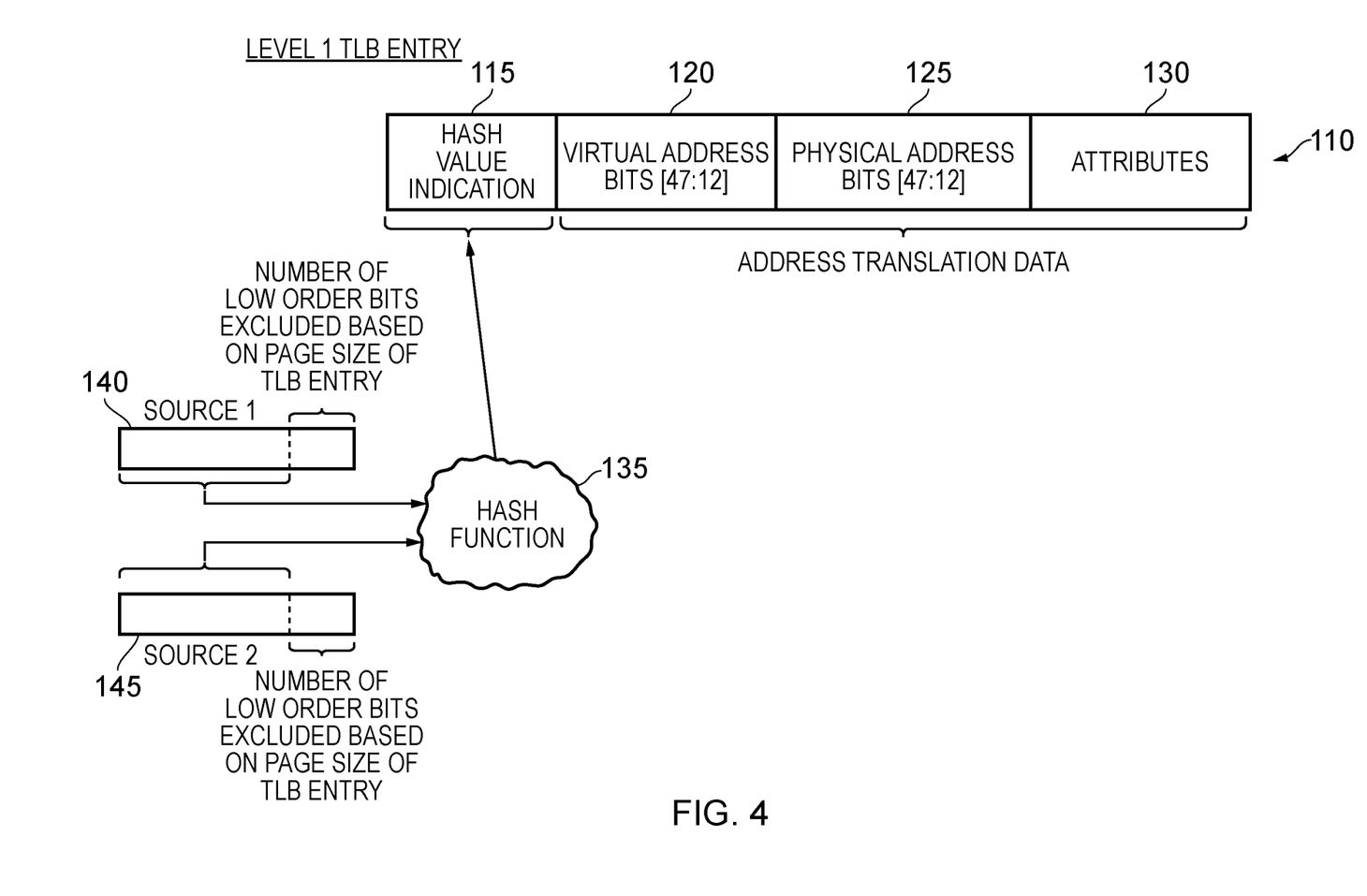
FIG. 4 is a diagram schematically illustrating an address translation cache entry that may be provided when the address translation cache adopts a fully associative structure, and in particular shows the generating of a hash value indication to be stored within such an address translation cache entry in accordance with one example arrangement.

FIG. 4 schematically illustrates fields that may be provided within each entry of the TLB 30 in accordance with one example arrangement. In particular an entry 110 is shown, which consists of the fields 120, 125 and 130 used to identify the address translation data. The field 120 is a virtual address field containing a certain number of the virtual address bits. In the example illustrated in FIG. 4, it is assumed that the page offset discussed earlier with reference to FIG. 2 is given by bits 11 to 0, and accordingly only the more significant bits starting from bit 12 need to be stored in the virtual address portion 120. In this example, it is assumed that the virtual address is a 48-bit value, and accordingly bits 47 to 12 are stored in the field 120.

The physical address field 125 then provides the corresponding physical address bits. Here it is assumed that the physical addresses are the same size as the virtual addresses, although this is not a requirement, and in some instances the physical address will have a different number of bits to the virtual address.

An attributes field 130 is also provided for storing a variety of additional information. For example, a sub-field within the attributes field 130 may capture a page size indication, indicating the page size associated with the address translation data in the entry. Purely by way of example, other attributes that can be captured within the field 130 include access permissions, and memory type information, such as whether the associated page relates to a writeback region of memory, a non-cacheable region, etc.

In addition to the normal address translation data fields, the TLB structure 30 is extended to include a hash value indication field 115 for each entry, the hash value indication field storing a hash value indication produced by the hash function 135 based on the relevant source values 140, 145. As indicated schematically in FIG. 4, a number of low order bits of each source value may be excluded from the input to the hash function, based on the page size associated with the TLB entry.

Figure 5:
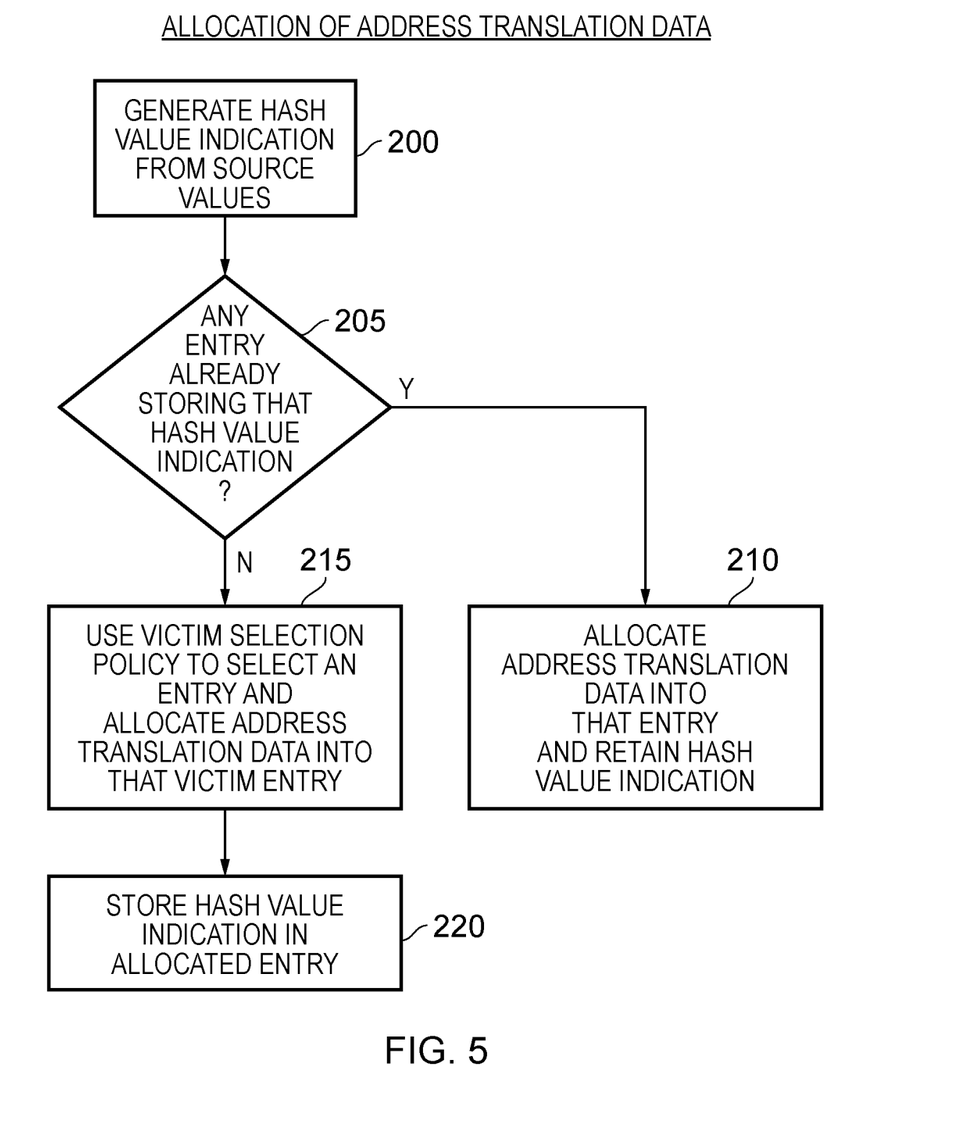
FIG. 5 is a flow diagram illustrating allocation of address translation data into a fully associative address translation cache in accordance with one example arrangement.

FIG. 5 is a flow diagram illustrating the allocation of address translation data into the TLB 30 in accordance with one example arrangement. At step 200, the hash value indication is generated from the source values, using the hash function 135 illustrated in FIG. 4. At step 205, the allocation circuitry then determines whether any entry within the TLB 30 already stores address translation data having that hash value indication associated with it. If so, then the process proceeds to step 210 where that entry is determined to be the allocated entry into which the new address translation data should be written. Accordingly, the new address translation data is used to overwrite the existing address translation data in that allocated entry and the hash value indication is retained within the field 115.

However, assuming there is not an existing entry that already stores the same hash value indication, then the process proceeds to step 215 where a victim selection policy is used to select one of the entries within the TLB 30, and the new address translation data is then allocated into that victim entry. Any suitable victim selection policy can be used, for example a least recently used policy, a most recently used policy, etc.

As indicated by step 220, the hash value indication is also stored in the allocated entry in addition to the address translation data.

Figure 6:
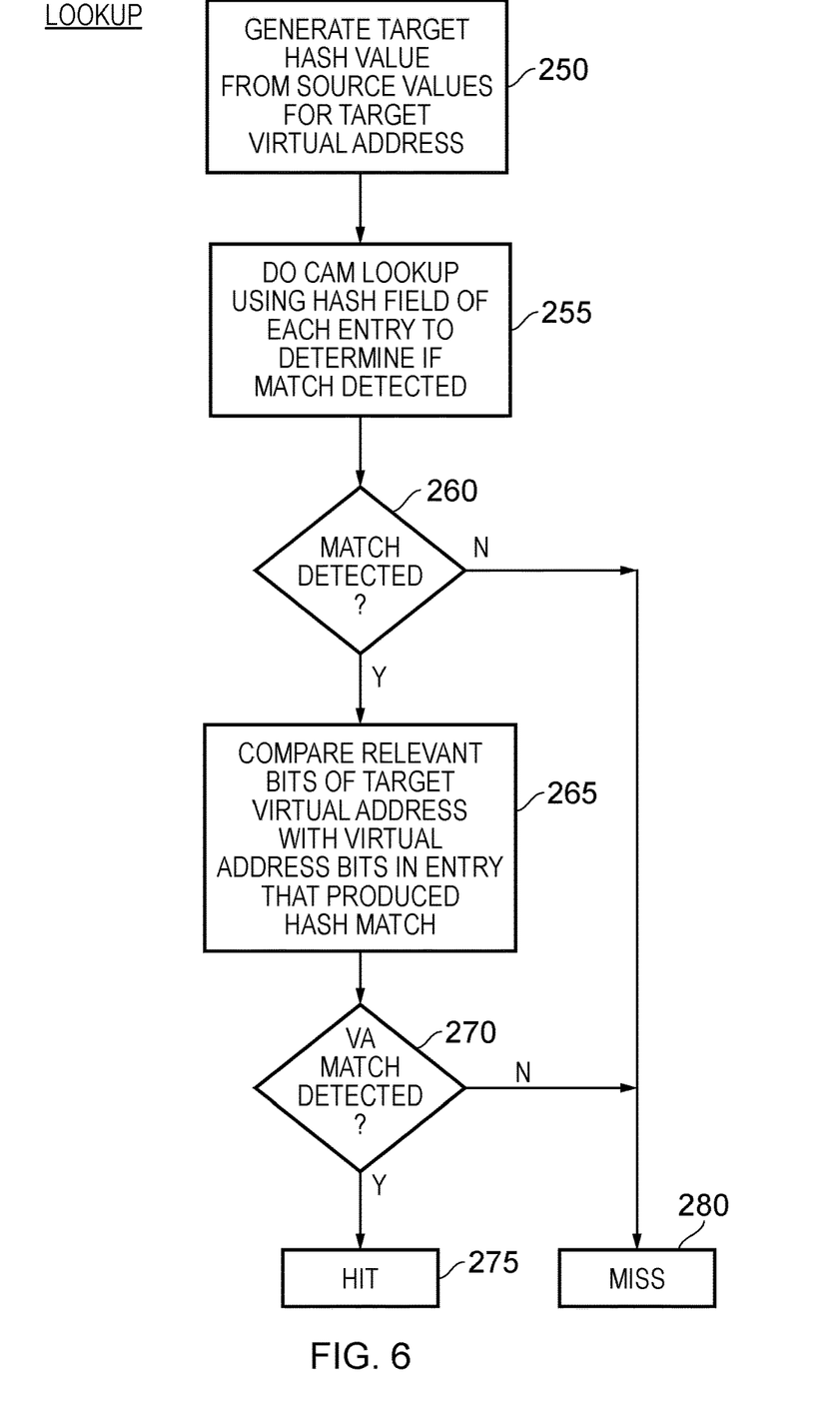
FIG. 6 is a flow diagram illustrating a lookup operation employed in respect of a fully associative address translation cache in accordance with one example arrangement.

FIG. 6 illustrates a lookup operation performed by the lookup circuitry 34 in accordance with one example arrangement. At step 250, a target hash value is generated from the source values associated with the target virtual address (that is the virtual address associated with an access request being issued by the core). As discussed earlier, the target hash value can in fact be generated before the target virtual address has been generated, based on the source values that the address generator 42 will be using to generate the target virtual address.

As indicated at step 255, a CAM lookup is then performed within the TLB 30 using the hash field of each entry and the target hash value generated at step 250, in order to determine if a match is detected. At step 260, if no match is detected, then it is determined that a miss has occurred at step 280.

However, if a match is detected, then for the time being the matching entry is considered as a candidate matching entry, but a further check is performed to determine whether it is actually a matching entry. In particular, as shown at step 265, the relevant bits of the target virtual address are compared with the corresponding virtual address bits in the entry that produced the hash match. The compare bits will depend on the page size information specified within the attributes field 130 of the candidate matching entry. In particular, considering the specific example of FIG. 4 discussed earlier, then depending on the page size it may not be necessary to obtain a match between all of the most significant bits down to bit 12.

At step 270, it is determined whether a virtual address match has been detected. If not, then the miss condition is determined to have occurred at step 280, but if the virtual address match is detected then a hit condition is determined to exist at step 275. In the presence of the hit condition, the candidate matching entry is now determined to be an actual matching entry, and the address translation data in that matching entry can then be used to convert the virtual address specified by the access request into a corresponding physical address within the memory system 15.

It will be appreciated that in some implementations additional checks may be required in addition to the virtual address check in order to determine that a hit is present. For example, identifier information for the application associated with the address translation data can be included within the entry, and a hit may be determined to exist only if the application identifier information in the entry of the TLB matches the application identifier information associated with the access request.

Figure 7A:
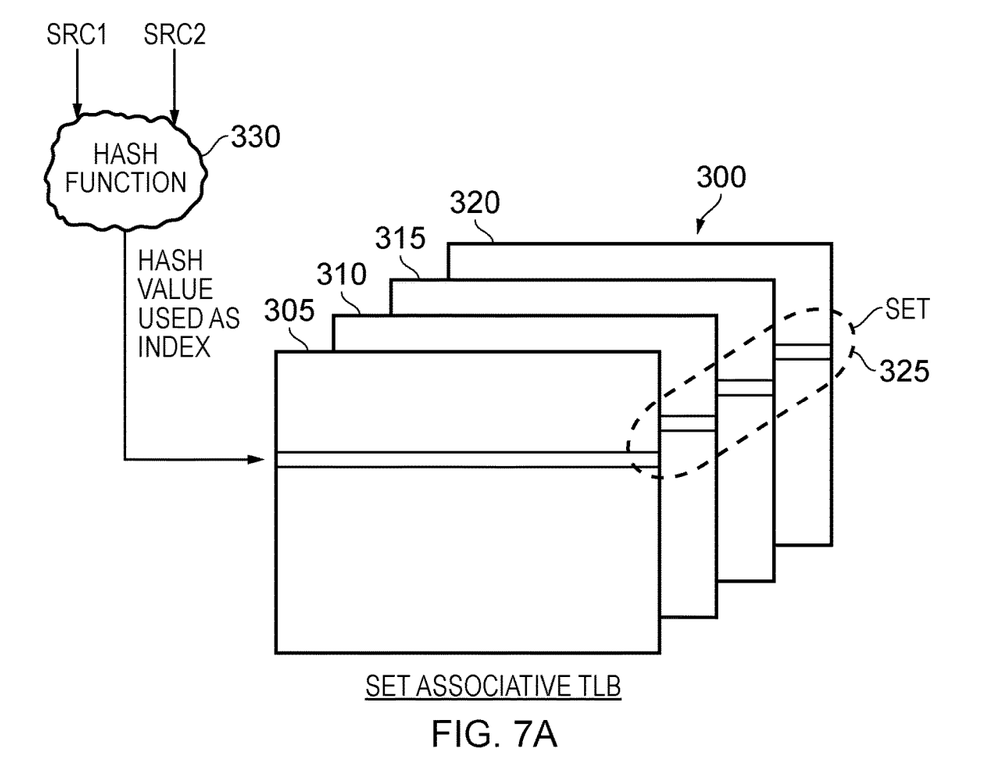
FIG. 7A illustrates how a hash value may be used as an index into an address translation cache arranged as a set associative structure in accordance with an alternative example arrangement.

Whilst in the above example the techniques are applied in respect of a fully associative TLB 30, they can also be used in association with a set associative TLB, as illustrated schematically in FIG. 7A. For example, the level two TLB 25 may be arranged as a set associative structure, and it may be possible to use the hash value mechanism in association with that set associative structure.

As indicated in FIG. 7A, the set associative TLB structure consists of a plurality of ways 305, 310, 315, 320, each way having a plurality of entries. In accordance with the techniques described herein, a hash function 330 is again used to generate a hash value from the source values, but that hash value is then used as an index to identify a particular set 325 within the set associative TLB. That identified set can then be considered to be a set of candidate matching entries. Hence, in the example of the four-way structure shown in FIG. 7A, the hash value is used to identify four candidate matching entries, namely one entry in each way of the set 325.

Figure 7B:
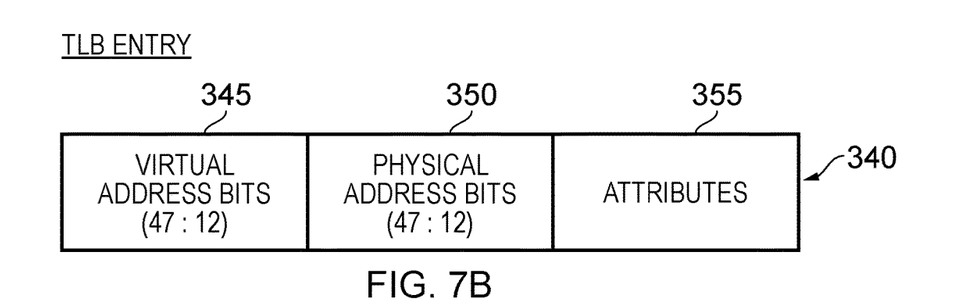
FIG. 7B illustrates fields that may be provided within an entry of such a set associative address translation cache in accordance with one example.

As shown in FIG. 7B, each TLB entry then stores the address translation data. In particular, each entry 340 contains the three fields 345, 350, 355, which correspond generally with the fields 120, 125, 130 shown in the earlier fully associative example of FIG. 4. It should be noted that the virtual address field 345 stores slightly more bits than would normally be stored in a set associative structure, since in a normal set associative structure a certain number of the virtual address bits would have been used as the index to identify the set. However, in accordance with the modified techniques described with reference to FIG. 7A, it is the hash value that is used as the index, and accordingly all of the relevant virtual address bits need to be captured within the virtual address field 345.

Figure 8:
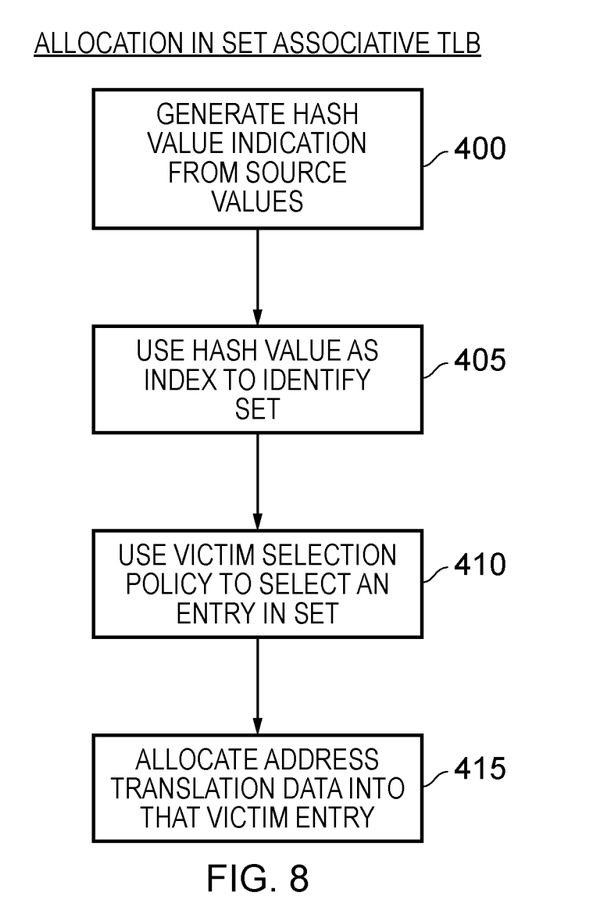
FIG. 8 is a flow diagram illustrating an allocation process employed in association with a set associative address translation cache in accordance with one example.

FIG. 8 is a flow diagram illustrating allocation of address translation data into the set associative TLB of FIG. 7A in accordance with one example implementation. At step 400, a hash value indication is generated from the source values, and that hash value indication is then used at step 405 as an index to identify a set within the TLB. At step 410, a victim selection policy is used to select an entry within the set, and then at step 415 the address translation data is allocated into the victim entry. Any suitable victim selection policy can be used at step 410 to identify one of the entries in the set whose contents are to be overwritten with the new address translation data.

Figure 9:
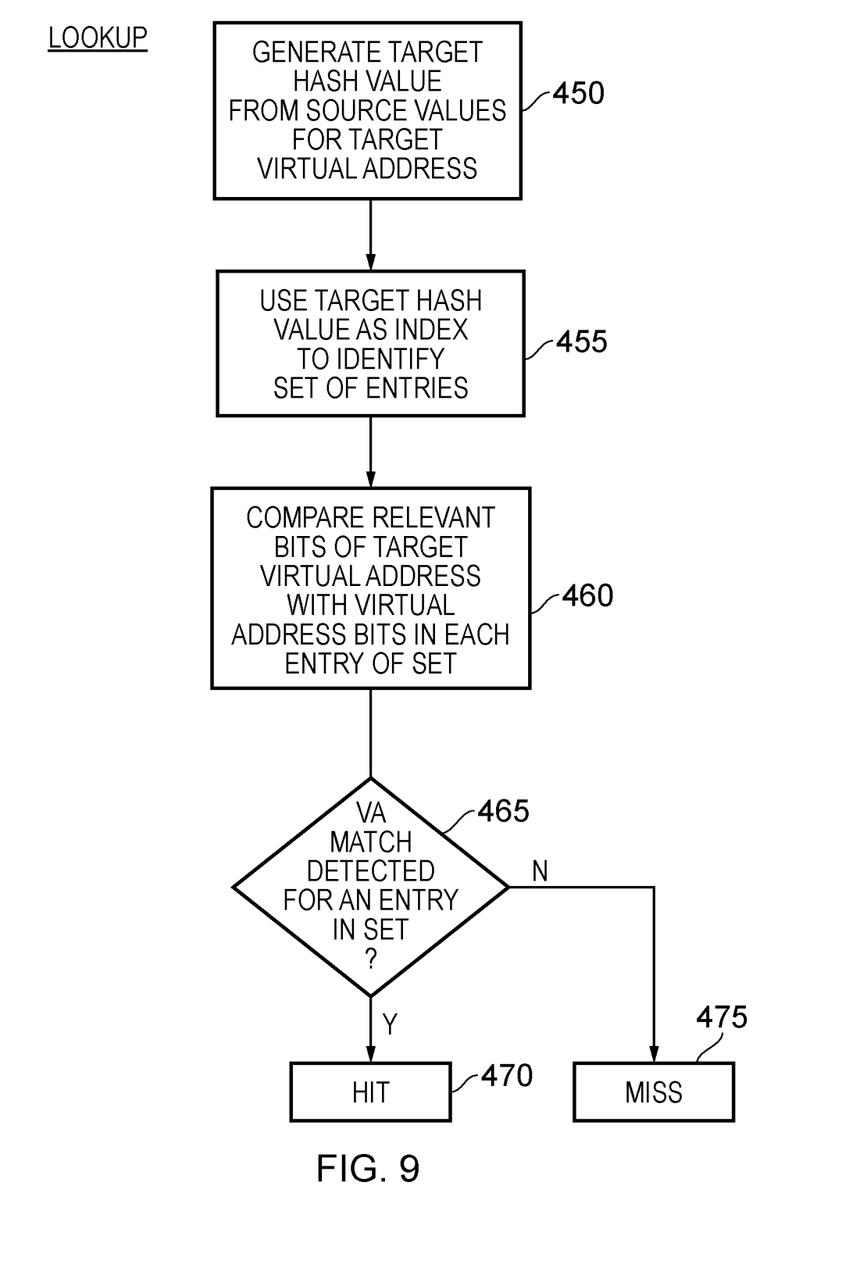
FIG. 9 is a flow diagram illustrating a lookup process employed in respect of a set associative address translation cache in accordance with one example.

FIG. 9 is a flow diagram illustrating a lookup operation that can be performed within the set associative TLB of FIG. 7A in accordance with one example implementation. At step 450, a target hash value is generated from the source values for the target virtual address, and then at step 455 that target hash value is used as an index to identify a set of entries within the TLB.

At step 460, then the relevant bits of the target virtual address are compared with corresponding virtual address bits in each entry of the set in order to determine whether a virtual address match is detected. If so, and if any other match criteria are met (for example a match between the application identifiers as discussed earlier), then at step 465 it will be determined that a match is detected, and a hit condition will be indicated at step 470. Otherwise, a miss condition will be indicated at step 475.

From the above described examples, it will be appreciated that the techniques described herein can give rise to performance benefits when accessing an address translation cache, and may also give rise to certain power consumption savings.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

Although illustrative embodiments of the invention have been described in detail herein with reference to the accompanying drawings, it is to be understood that the invention is not limited to those precise embodiments, and that various changes, additions and modifications can be effected therein by one skilled in the art without departing from the scope and spirit of the invention as defined by the appended claims. For example, various combinations of the features of the dependent claims could be made with the features of the independent claims without departing from the scope of the present invention.

The invention claimed is:

1. An apparatus comprising:
    an address translation cache having a plurality of entries, each entry to store address translation data used when converting a virtual address into a corresponding physical address of a memory system, the virtual address being generated from a plurality of source values;
    allocation circuitry, responsive to received address translation data, to allocate an entry within the address translation cache to store the received address translation data, a hash value indication being associated with the allocated entry, where the hash value indication is computed from the plurality of source values used to generate a virtual address associated with the received address translation data; and
    lookup circuitry, responsive to an access request associated with a target virtual address, to perform a lookup process employing a target hash value computed from the plurality of source values used to generate the target virtual address, in order to identify any candidate matching entry in the address translation cache, and when there is at least one candidate matching entry to then perform a virtual address check process in order to determine whether any candidate matching entry is an actual matching entry whose address translation data enables the target virtual address to be translated to a corresponding target physical address;
    wherein the lookup circuitry is configured to start the lookup process employing the target hash value before the target virtual address has been generated using the plurality of source values.

2. An apparatus as claimed in claim 1, further comprising:
    hash generation circuitry, responsive to receipt of a plurality of source values from a request source, to generate a corresponding hash value.

3. An apparatus as claimed in claim 1, wherein the address translation data in each entry is associated with a range of virtual addresses, and the lookup circuitry is arranged to determine presence of the actual matching entry when the target virtual address falls within the range of virtual addresses covered by the address translation data in a candidate matching entry.

4. An apparatus as claimed in claim 3, wherein the lookup circuitry is arranged to perform the virtual address check process to determine whether a specified portion of the target virtual address matches a corresponding portion of the virtual address indication of the address translation data in a candidate matching entry, the specified portion being dependent on the range.

5. An apparatus as claimed in claim 3, wherein the hash value indication is computed using selected portions of the plurality of source values, the selected portions being selected dependent on the range of virtual addresses associated with the received address translation data.

6. An apparatus as claimed in claim 1, wherein:
    the address translation cache has a fully associative structure; and
    the allocation circuitry is arranged to associate the hash value indication with the allocated entry by storing the hash value indication in association with the allocated entry.

7. An apparatus as claimed in claim 6, wherein the allocation circuitry is arranged to prevent more than one entry having the same hash value indication associated therewith.

8. An apparatus as claimed in claim 6, wherein the lookup circuitry is arranged to implement the lookup process by comparing the target hash value with the hash value indication stored in association with each entry, such that an entry is identified as a candidate matching entry when a match is detected between its associated hash value indication and the target hash value.

9. An apparatus as claimed in claim 8, wherein the lookup process will identify at most one candidate matching entry.

10. An apparatus as claimed in claim 1, wherein:
    the address translation cache has a set associative structure; and
    the allocation circuitry is arranged to associate the hash value indication with the allocated entry by using the hash value indication as an index to identify a set of entries within which the received address translation data is allowed to be allocated.

11. An apparatus as claimed in claim 10, wherein the lookup circuitry is arranged to use the target hash value during the lookup process to identify a set of entries within the address translation cache, with the set of entries forming a set of candidate matching entries.

12. The apparatus according to claim 1, wherein the plurality of source values comprise a base value and an index value to be added together to generate the target virtual address.

13. A method of accessing an address translation cache having a plurality of entries, each entry storing address translation data used when converting a virtual address into a corresponding physical address of a memory system, the virtual address being generated from a plurality of source values, the method comprising:
    allocating, responsive to received address translation data, an entry within the address translation cache to store the received address translation data, a hash value indication being associated with the allocated entry, where the hash value indication is computed from the plurality of source values used to generate a virtual address associated with the received address translation data;

performing a lookup process in response to an access request associated with a target virtual address, the lookup process employing a target hash value computed from the plurality of source values used to generate the target virtual address, in order to identify any candidate matching entry in the address translation cache; and when the lookup process identifies at least one candidate matching entry, performing a virtual address check process in order to determine whether any candidate matching entry is an actual matching entry whose address translation data enables the target virtual address to be translated to a corresponding target physical address;

wherein the lookup process employing the target hash value is started before the target virtual address has been generated using the plurality of source values.

14. An apparatus comprising:

address translation cache means having a plurality of entries, each entry for storing address translation data used when converting a virtual address into a corresponding physical address of a memory system, the virtual address being generated from a plurality of source values;

allocation means for allocating, responsive to received address translation data, an entry within the address translation cache means to store the received address translation data, a hash value indication being associated with the allocated entry, where the hash value indication is computed from the plurality of source values used to generate a virtual address associated with the received address translation data; and lookup means, responsive to an access request associated with a target virtual address, for performing a lookup process employing a target hash value computed from the plurality of source values used to generate the target virtual address, in order to identify any candidate matching entry in the address translation cache means, and when there is at least one candidate matching entry for then performing a virtual address check process in order to determine whether any candidate matching entry is an actual matching entry whose address translation data enables the target virtual address to be translated to a corresponding target physical address;

wherein the lookup means is arranged to start the lookup process employing the target hash value before the target virtual address has been generated using the plurality of source values.

* * * * *